United States Patent [19]
Yializis et al.

[11] Patent Number: 6,118,218
[45] Date of Patent: Sep. 12, 2000

[54] STEADY-STATE GLOW-DISCHARGE PLASMA AT ATMOSPHERIC PRESSURE

[75] Inventors: Angelo Yializis; Shahid A. Pirzada; Wolfgang Decker, all of Tucson, Ariz.

[73] Assignee: Sigma Technologies International, Inc., Tucson, Ariz.

[21] Appl. No.: 09/241,882

[22] Filed: Feb. 1, 1999

[51] Int. Cl.⁷ ...................................................... H05H 1/24
[52] U.S. Cl. .................................. 315/111.21; 118/723 E; 219/121.36
[58] Field of Search ........................ 315/111.21, 111.31; 313/231.13, 231.41; 219/121.36; 118/723 E, 723 ER

[56] References Cited

U.S. PATENT DOCUMENTS

| | | | |
|---|---|---|---|
| 4,496,423 | 1/1985 | Walton | 156/345 |
| 4,507,539 | 3/1985 | Sando et al. | 219/121.36 X |
| 5,366,555 | 11/1994 | Kelly | 118/723 E |
| 5,753,886 | 5/1998 | Iwamura et al. | 219/121.43 |

*Primary Examiner*—Justin P. Bettendorf
*Attorney, Agent, or Firm*—Antonio R. Durando

[57] ABSTRACT

A plasma treater incorporates a porous metallic layer in one of the electrodes. The porous layer is selected with pores of average size within one order of magnitude of the mean free path of the plasma gas at atmospheric pressure. The plasma gas is injected into the electrode at substantially atmospheric pressure and allowed to diffuse through the porous layer, thereby forming a uniform glow-discharge plasma. The film material to be treated is exposed to the plasma created between this electrode and a second electrode covered by a dielectric layer. Because of the micron size of the pores of the porous metal, each pore also produces a hollow cathode effect that facilitates the ionization of the plasma gas. As a result, a steady-state glow-discharge plasma is produced at atmospheric pressure and at power frequencies as low as 60 Hz.

22 Claims, 6 Drawing Sheets

STEADY-STATE GLOW-DISCHARGE PLASMA AT ATMOSPHERIC PRESSURE

BACKGROUND OF THE INVENTION

1. Field of the Invention

This invention relates generally to methods and apparatus for producing plasma; in particular, the invention relates to establishing a steady-state glow-discharge plasma at atmospheric pressure and low temperatures.

2. Description of the Related Art

Plasma is an ionized form of gas that can be obtained by ionizing a gas or liquid medium using an AC or DC power source. A plasma, commonly referred to as the fourth state of matter, is an ensemble of randomly moving charged particles with sufficient density to remain, on average, electrically neutral. Plasmas are used in very diverse processing applications, ranging from the manufacture of integrated circuits for the microelectronics industry, to the treatment of fabric and the destruction of toxic wastes.

In particular, plasmas are widely used for the treatment of organic and inorganic surfaces to promote adhesion between various materials. For example, polymers that have chemically inert surfaces with low surface energies do not allow good bonding with coatings and adhesives. Thus, these surfaces need to be treated in some way, such as by chemical treatment, corona treatment, flame treatment, and vacuum plasma treatment, to make them receptive to bonding with other substrates, coatings, adhesives and printing inks. Corona discharge, physical sputtering, plasma etching, reactive ion etching, sputter deposition, plasma-enhanced chemical vapor deposition, ashing, ion plating, reactive sputter deposition, and a range of ion beam-based techniques, all rely on the formation and properties of plasmas.

Corona discharges are widely used in particular for treating plastic films, foils, papers, etc. to promote adhesion with other materials by increasing the surface energy of the film. A corona discharge is established between two electrodes by applying a high voltage to one of the electrodes while the other is connected to ground at typical frequencies in the order of 10–50 kHz. These conditions produce locally concentrated discharges known in the art as streamers, which lead to some non-uniformity in the treatment of film surfaces and can also damage the film by producing low molecular weight species that adversely affect adhesion to the surface. Furthermore, the streamers of corona treatment can produce backside effects on the film being treated, which is undesirable in many applications. Nevertheless, corona treatment is extensively used in the industry for improving the surface energy of materials.

Glow-discharge plasma treatment is also an effective method of treating surfaces to increase their wettability and adhesion to various materials. Glow discharge provides a more uniform and homogenous plasma that produces a more consistent surface treatment than corona treatment, thereby avoiding unintentional back treatment of the film. Glow-discharge plasma is characterized by high-energy electrons that collide with, dissociate and ionize low-temperature neutrals, creating highly reactive free radicals and ions. These reactive species enable many chemical processes to occur with otherwise unreactive low-temperature feed stock and substrates. Based on these properties, low-density glow-discharge plasmas are usually utilized for low material-throughput processes involving surface modification. These plasmas are typically formed by partially ionizing a gas at a pressure well below atmosphere. For the most part, these plasmas are weakly ionized, with an ionization fraction of $10^{-5}$ to $10^{-1}$, established with AC or DC power in systems with varied geometries. These systems always require vacuum chambers and pumps to maintain a low pressure, which increases operating costs and maintenance.

There has been an extensive effort to develop plasma systems capable of operating at atmospheric pressure for surface treatment of polymer films, foils, and paper, in order to avoid capital and maintenance expenditures for vacuum chambers and pumps. It is known that atmospheric plasma can be generated at relatively low temperatures with a proper power source, the insertion of a dielectric layer between the electrodes, and the use of an appropriate gas mixture as plasma medium. For surface treatment of polymer films, fabrics, paper, etc., atmospheric plasma can be established between two electrodes using an inert gas such as helium under particular operating conditions. Usually one electrode is attached to a high voltage power supply, and a rotating drum is grounded and acts as the other electrode. One electrode is coated with a ceramic layer and the plasma gas is injected between electrodes.

For example, U.S. Pat. No. 5,456,972 describes a glow-discharge plasma system operating at atmospheric pressure. The apparatus consists of a pair of spaced plate electrodes energized over a range of about 1 to 5 KV rms at a radio frequency of about 1 to 100 KHz. A plasma gas is injected between the plates and the film to be treated is passed through them and exposed to the resulting plasma discharge for a predetermined period of time.

U.S. Pat. No. , 5,789,145 discloses an atmospheric-pressure glow-discharge system based on conventional corona discharge apparatus. The improvement consists of pumping a gas comprising mostly helium through a gas delivery system containing slits that distribute the flow uniformly to the electrode arrangement. Various other patents describe particular gas compositions that enable the production of atmospheric or near-atmospheric pressure glow-discharge plasma for particular applications. See, for example, U.S. Pat. Nos. 5,387,842, 5,403,453, 5,414,324, 5,558,843, 5,669,583, 5,767,469, and 5,789,145.

In an attempt to improve the uniformity of the plasma created at atmospheric pressure and avoid the formation of streamers typical of corona treatment, perforated electrodes and screens have also been used. For example, U.S. Pat. No. 5,714,308 teaches a method for establishing a uniform atmospheric plasma between two electrodes using an inert gas or a mixture of gases as plasma medium. One of the electrodes is connected to an AC power supply. The other electrode is covered with an insulating material. As is, such an electrode arrangement will produce a corona discharge if powered by a voltage at 40–500 kHz. The invention consists of providing uniformly spaced holes in one electrode with a diameter of the order of 1 mm and pumping a gas through the holes, which has been found to produce atmospheric glow-discharge plasma at these frequencies using mixtures of helium and other gases, such as $N_2$ and $O_2$, so long as such other gases do not exceed 8.0%.

Thus, it has been shown that a uniformly perforated structure placed between electrodes improves gas diffusion and, correspondingly, makes it possible to obtain some level of glow-discharge plasma at higher pressures than previously possible. Other than under very specific operating conditions and limited gas compositions, though, these system cannot produce a uniform glow discharge at atmospheric pressure.

Therefore, there is still a need for a plasma treatment system capable of producing a steady glow discharge at atmospheric pressure with different gas mixtures. In addition, it would be desirable to be able to operate such a system at frequencies as low as 60 Hz.

BRIEF SUMMARY OF THE INVENTION

One primary objective of this invention is a method and apparatus for producing a glow-discharge plasma at atmospheric pressure.

Another important goal of the invention is a method and apparatus that provides a glow discharge under steady-state conditions.

Another objective of the invention is a procedure that produces a relatively low-temperature plasma.

Another objective is a process that can be carried out using a power system operating at relatively low frequencies.

Still another objective is a method and apparatus that are suitable for incorporation with existing plasma equipment.

A final objective is a procedure that can be implemented easily and economically according to the above stated criteria.

Therefore, according to these and other objectives, the preferred embodiment of the invention consists of incorporating a porous metallic layer in one of the electrodes of a plasma treatment system. A plasma gas is injected into the electrode at substantially atmospheric pressure and allowed to diffuse through the porous layer, thereby forming a uniform glow-discharge plasma. As in prior-art devices, the film material to be treated is exposed to the plasma created between this electrode and a second electrode covered by a dielectric layer. Because of the micron size of the pores of the porous metal, each pore also produces a hollow cathode effect that facilitates the ionization of the plasma gas. As a result, a steady-state glow-discharge plasma is produced at atmospheric pressure and at power frequencies as low as 60 Hz.

Various other purposes and advantages of the invention will become clear from its description in the specification that follows and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose only some of the various ways in which the invention may be practiced.

DESCRIPTION OF THE PREFERRED EMBODIMENTS OF THE INVENTION

Figure 1:
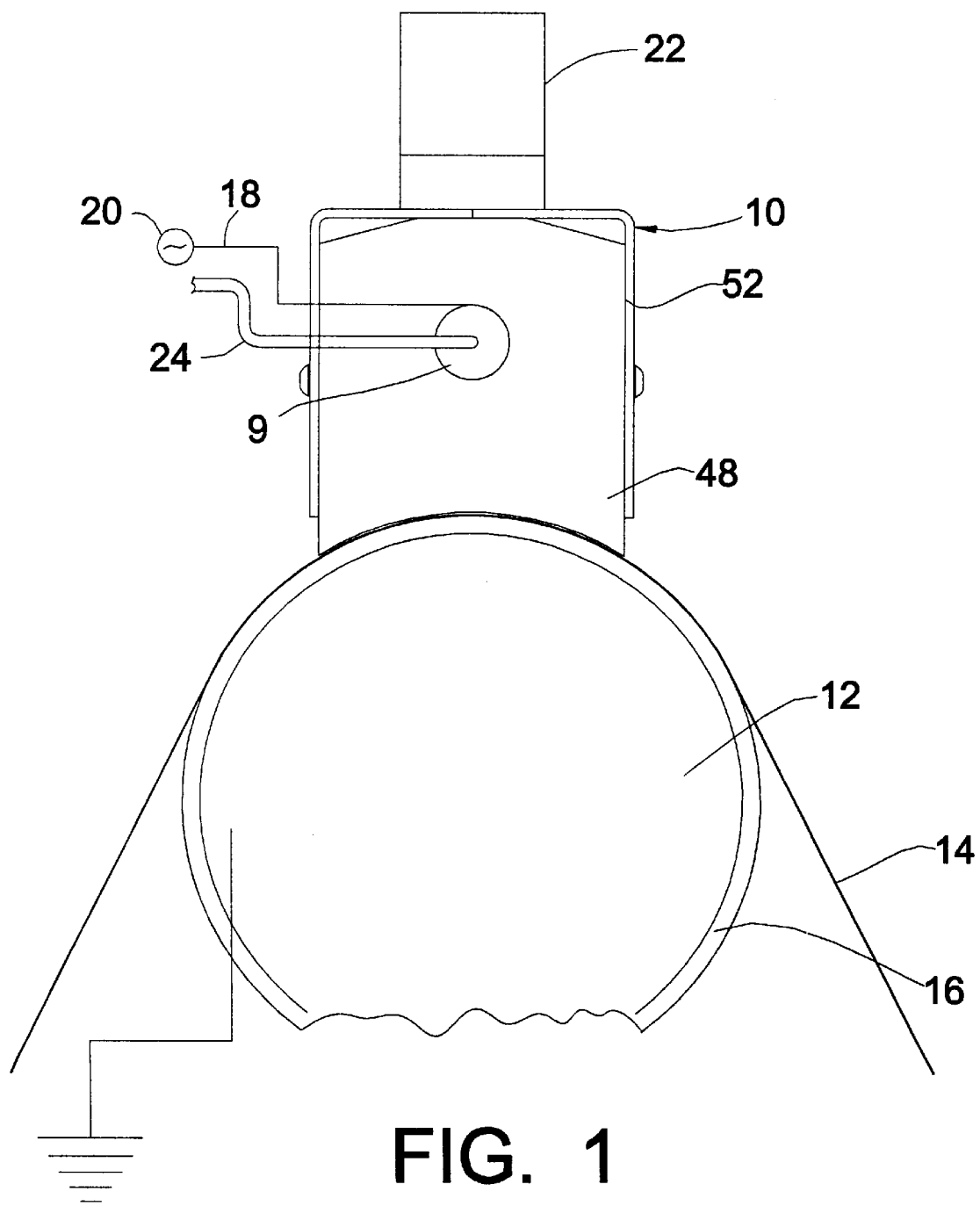
FIG. 1 is a schematic representation of an atmospheric plasma treater 10 according to the invention.

The heart of this invention lies in the incorporation a porous-metal layer in one of the electrodes of an atmospheric plasma treatment unit and the forced diffusion of the plasma medium through such porous structure. During experimental work performed to improve prior-art results obtained with perforated electrodes and/or wire mesh for diffusing the flow of plasma gas, the inventors realized that, in order for the electrode holes to operate effectively for producing glow discharge, their size must approach the mean free path of the plasma gas at the system's operating pressure. As commonly understood in the art, for the purposes of this disclosure the terms size and effective size of the pores refer to a hypothetical diameter equal to the geometric mean of the largest and smallest dimension of the pore.

At atmospheric pressure, the mean free path of all gases typically used to produce plasma is in the submicron to micron range. Initial attempts with a metallic mesh screen (mesh size 600–200) produced significant improvements over the prior art, which are considered encompassed by the present invention. However, even a 600-mesh screen produces holes that are more than 20 microns in diameter, which is considerably larger than the mean free path of plasma gases at atmospheric pressure. Helium, for example, has a mean free path of about 0.13 micron at one atmosphere. A search for ways to produce micron- and submicron-size holes led to the idea of constructing an electrode out of porous metal, such that the size of the pores could be controlled by the proper choice of the metal-grain size used to produce the electrode.

As those skilled in the art would readily understand, a porous metal is a material produced by powder metallurgy. Metal powder particles of desired size are blended with a binder, if necessary, then pressed and sintered to produce a solid porous structure. The pore size is controlled by the size of the powder grains used as raw material. The term "porous metal," as used in this disclosure, is intended to refer to such materials.

By judiciously selecting the grain size and the type of metal used for producing the porous metallic layer, the electrode design of the invention can provide a structure with densely and uniformly distributed holes as small as 0.1 micron in diameter. The high density of holes in the electrode creates a uniform high-density plasma that prevents corona streamer formation and allows the use of much broader ranges of voltage frequencies and gas mixtures than previously possible. The submicron/micron size of the holes approximates the mean free path of the plasma gas and it is believed to allow each pore hole to act as a hollow cathode during the negative part of the voltage cycle. This generates intense plasma that in turn enhances the level of treatment.

We found that the ideal pore size for a particular application is approximately within one order of magnitude greater than the mean free path of the plasma medium at the chosen operating conditions. Thus, working with helium as the main plasma-gas component, we found that a steady atmospheric glow discharge could be sustained easily even at very low frequencies using porous metals with pores up to 10 microns in size. As the size of the pores increased over approximately 10 microns in diameter, a uniform plasma could only be produced with a high content of helium and at higher frequencies.

Referring to the drawings, wherein like parts are designated throughout with like numerals and symbols, FIG. 1 shows a general layout of an atmospheric plasma treater 10 according to the invention. The plasma treater 10 is shown mounted on the roller 12 of a conventional web-treatment system. A film 14 of material to be treated is passed through the system between the plasma treater and the roller at speeds typically ranging from 1 to 200 ft/min. The roller 12 is grounded and coated with a dielectric material 16 such as polyethylene teraphthalate (PET). Other materials with different dielectric constants ranging from 3 to 1000, such as alumina, silica, barium titanate, and strontium titanate, could be used as equivalent dielectric material. The plasma treater 10 contains at least one electrode according to the invention (shown in FIG. 2) which is connected, through a cable 18, to an AC power supply 20 operating at any frequency between 60 Hz and the maximum frequency available from the power supply. The treater is held in place conventionally by a holding bracket 22 to maintain a distance of 1–2 mm between the roller 12 and the treater 10. This distance, which varies with operating conditions, plasma medium composition, and electrode configuration, is important in establishing a steady plasma flow; therefore, it is very desirable to maintain a gap determined to be optimal. Plasma gas, such as helium, argon, and mixtures of an inert gas with nitrogen, oxygen, air, carbon dioxide, methane, acetylene, propane, ammonia, or mixtures thereof, can be used with this treater to sustain a uniform and steady plasma. The gas is supplied to the treater 10 through a manifold 24 that feeds the porous electrode of the invention.

Figure 2:
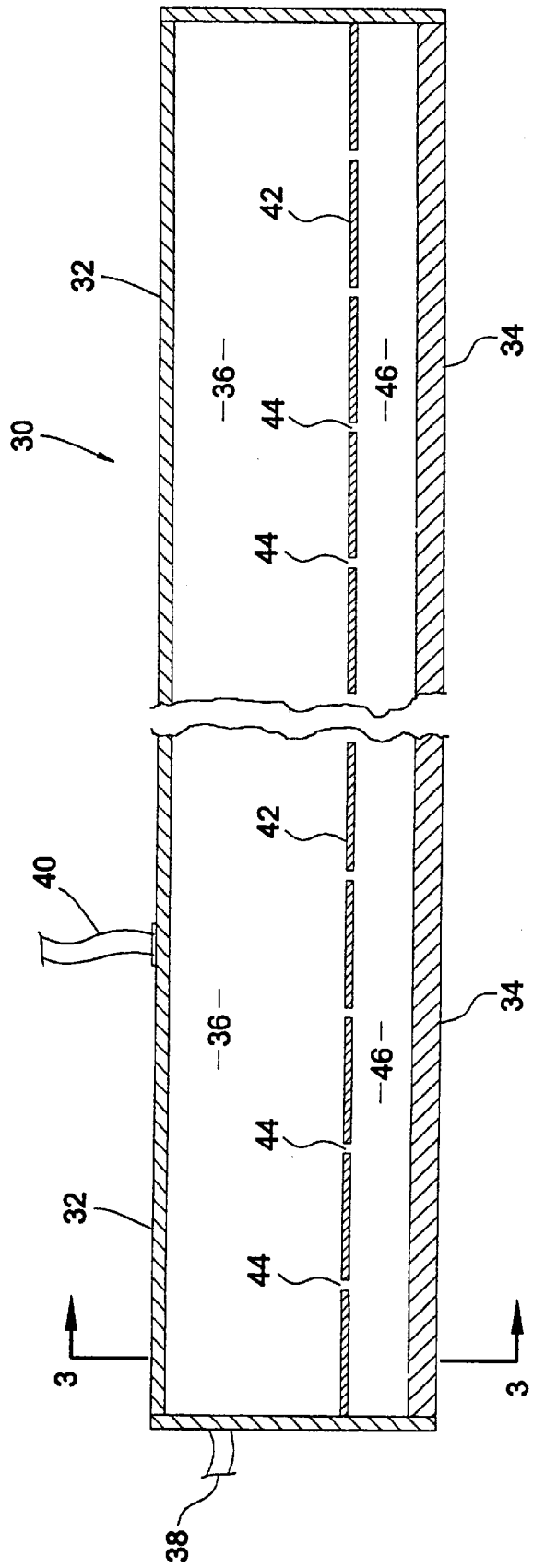
FIG. 2 is a partially cut-out, side sectional view of an electrode containing a porous-metal component according to the preferred embodiment of the invention, shown as seen from line 2—2 in FIG. 3.
Figure 3:
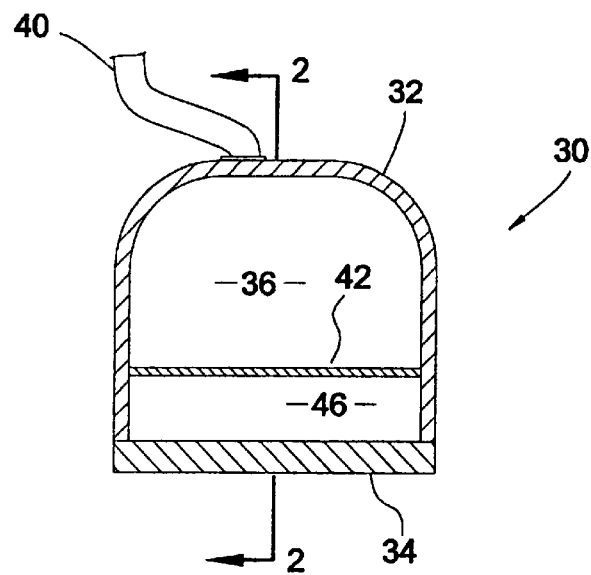
FIG. 3 is a front sectional view of the electrode of FIG. 2 as seen from line 3—3 in that figure.

FIGS. 2 and 3 illustrate in side and front elevational view, respectively, a plasma treater electrode 30 according to a preferred embodiment of the invention. The electrode consists of a closed-ended tubular structure preferably constructed by enclosing a hollow metallic housing 32 with a porous metal layer 34 having pores sized to approximate the mean free path of the plasma gas intended to be used in the treater. The gas is fed to the upper portion 36 of the hollow electrode 30 at substantially atmospheric pressure through an inlet pipe 38 connected to the exterior manifold 24. Similarly, the electrode is energized by an electrical wire 40 connected to the power system through the exterior cable 18. The electrode 30 preferably includes a distribution baffle 42 containing multiple, uniformly spaced apertures 44 designed to distribute the gas uniformly throughout the length of the bottom portion 46 of the hollow electrode 30. While the presence of the baffle 42 is not critical to the invention, as a result of this configuration the gas pressure against the bottom porous layer 34 can be maintained uniform and consistent through feed fluctuations, which contributes to the production of a uniform glow-discharge plasma.

Figure 4:
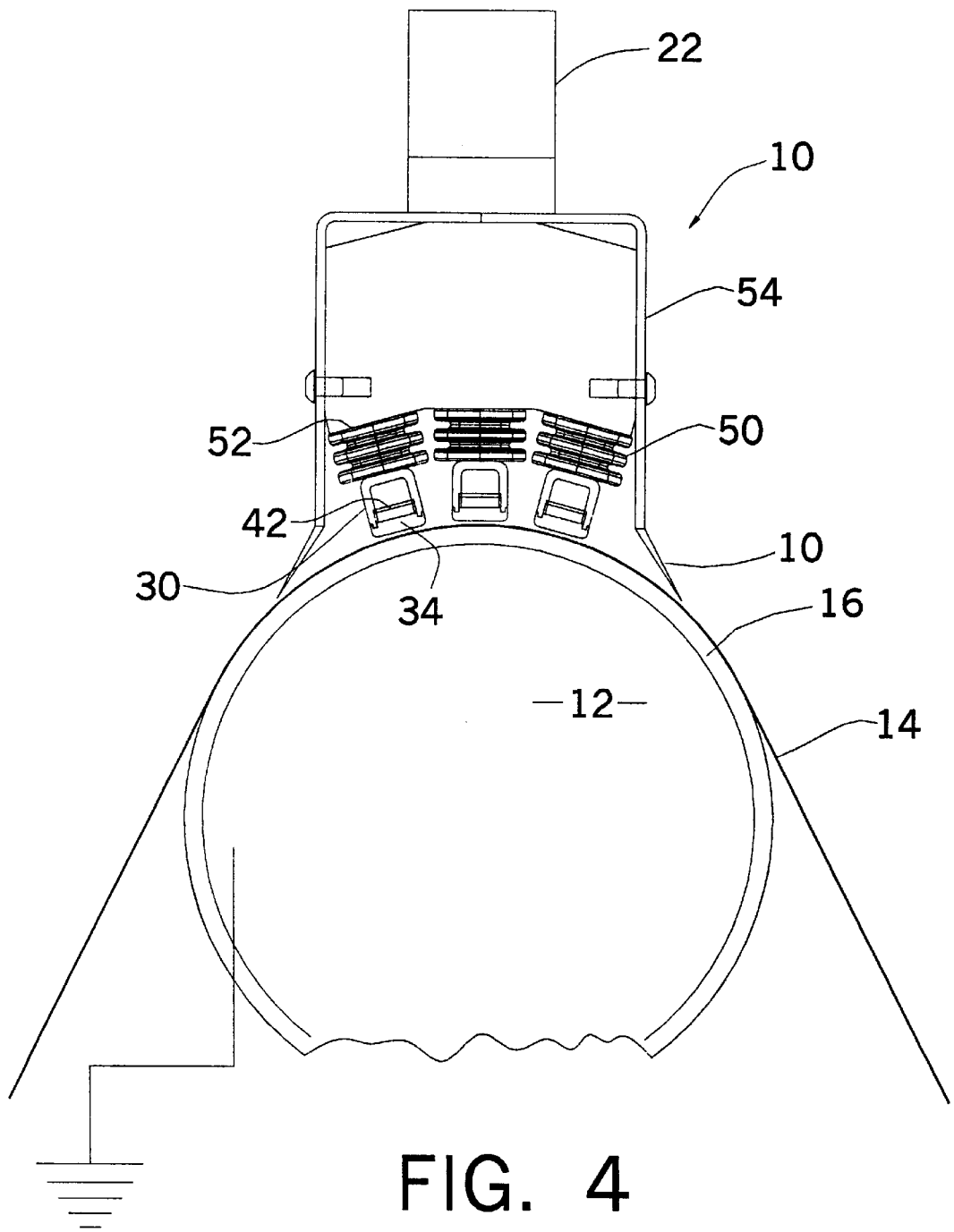
FIG. 4 illustrates in front view a plasma treater with three elements of a porous electrode according to the invention.

FIG. 4 illustrates in front view a plasma treater 10 (without the front cover 48 seen in FIG. 1) with three elements of a porous electrode 30 according to the invention. These are preferably made of stainless steel, such as SS316, but the porous layer 34 of the electrode can alternatively be made of other material that may be better suited to produce the desired porous size for a particular application. Each electrode element is held in place by a ceramic insulator 50 and a metallic support 52 attached to the cover 54 of the plasma treater. Each electrode element is typically provided with a separate height adjustment mechanism (not shown in the figures) to permit its alignment with the roller 12. The cover 54 of the plasma treater preferably extends on both sides over the roller 12 to minimize ambient air inflow into the plasma treater.

The baffle 42 separating the upper and lower portions 36,46 of each electrode 30 preferably consists of a stainless steel plate with 1-mm holes spaced every 10 cm along the main axis of the plate. The stainless steel porous metal strip 34 is attached to the bottom of the electrode to form an enclosed structure. The thickness of the porous metal layer 34 can vary to produce the desired plasma flow, depending on the pressure of the gas feed and the size and density of the pores, but thicknesses from about 1.5 mm to 6.5 mm have been shown to yield very good results. Porous metals such as these are used in other applications such as for filter elements of gas lines and ball bearings, and are commercially available from companies such as the Mott Corporation of Farmington, Conn. These commercial porous metals have pores ranging from 0.1 to 20 microns in diameter.

Figure 5:
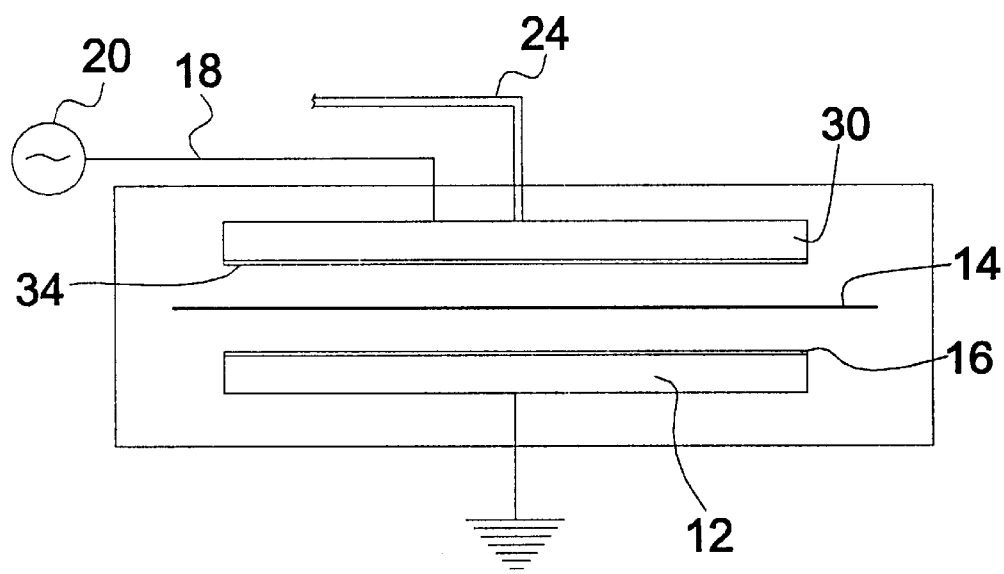
FIG. 5 is a schematic representation of the embodiment of the invention using an electrode containing a porous-metal strip.
Figure 6:
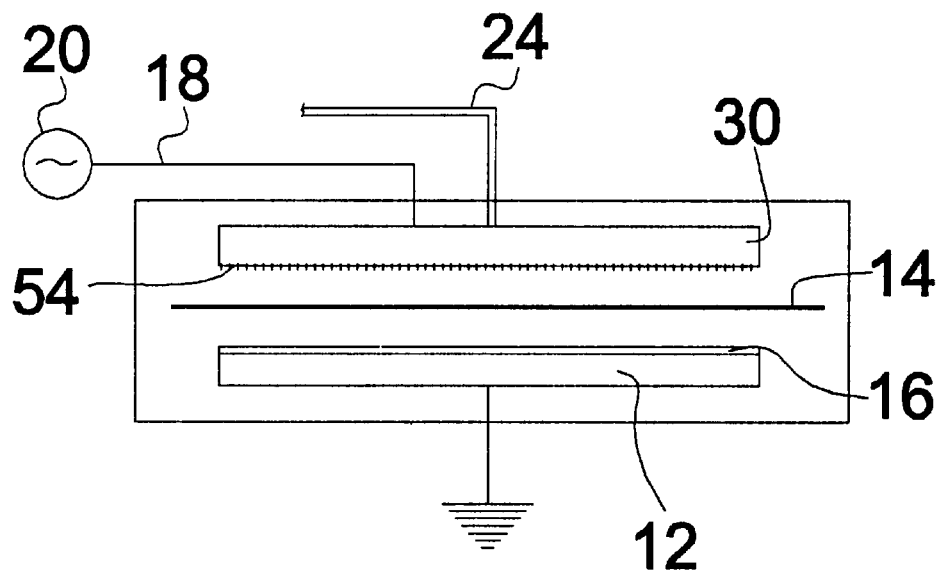
FIG. 6 is a schematic representation of the embodiment of the invention using an electrode containing a porous wire-cloth strip.
Figure 7:
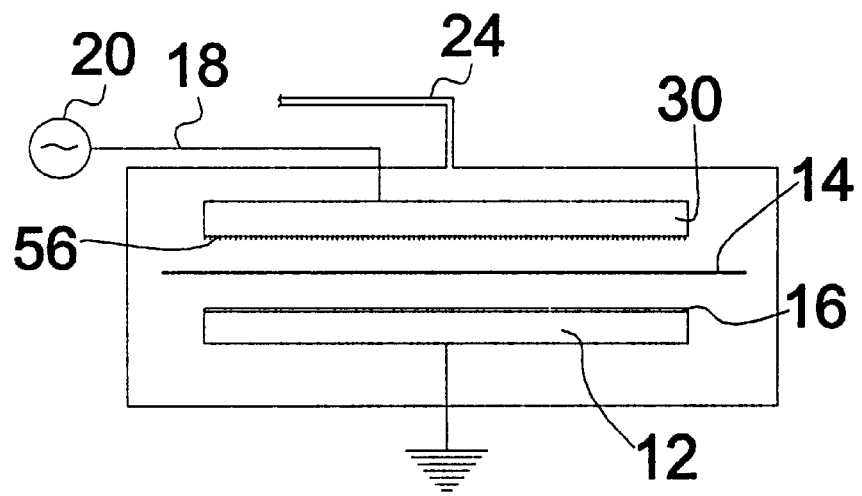
FIG. 7 is a schematic representation of the embodiment of the invention using an electrode a porous wire-cloth strip wrapped over a conventional electrode.
Figure 8:
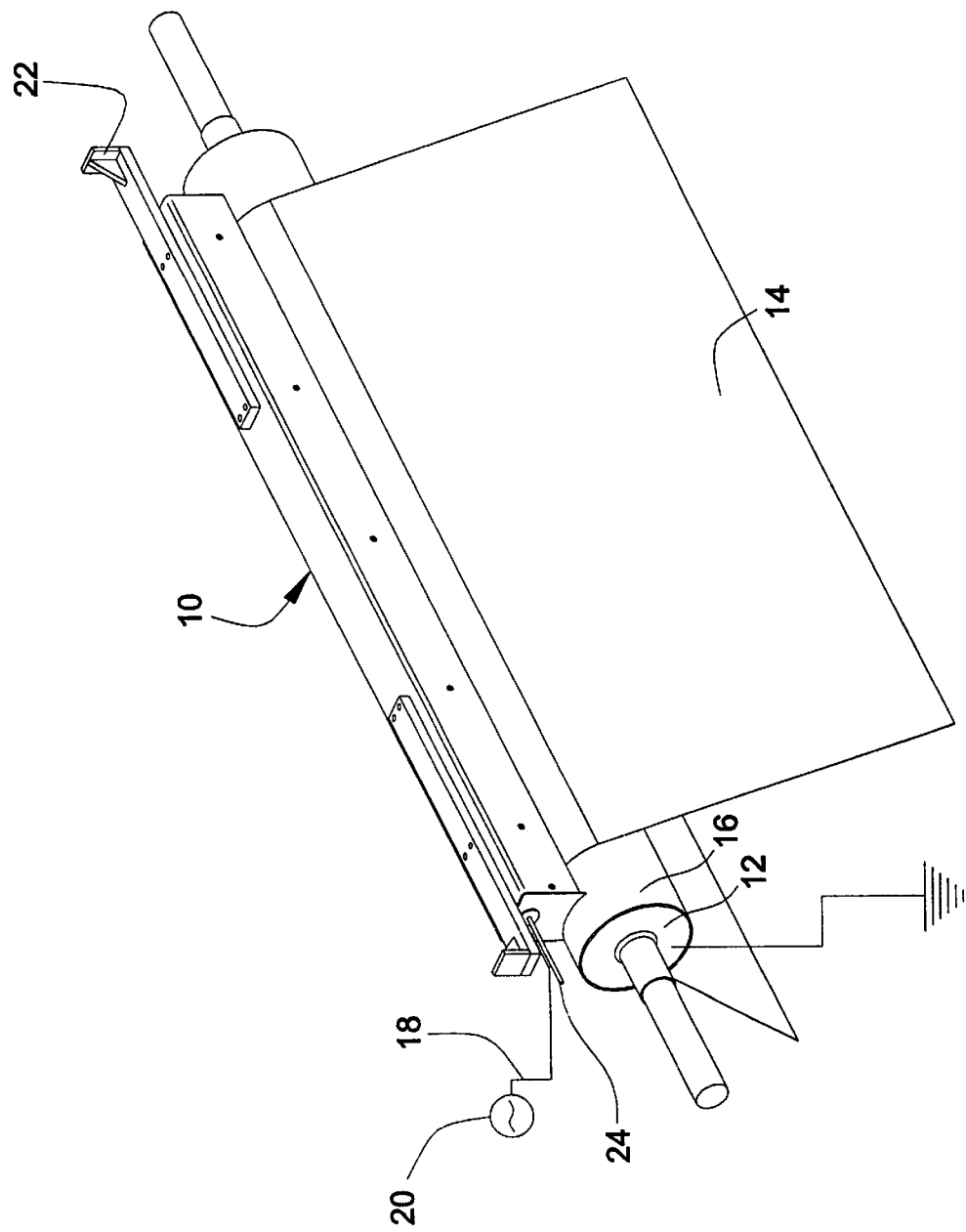
FIG. 8 is a perspective view of the plasma treater of the invention placed on a conventional web roller.

In another embodiment of the invention, which is not preferred but was tested with significant success before we realized the advantages of using porous metals, a metal cloth with very tight mesh was used to enclose the hollow metallic housing 32 of the electrode 30. The configuration of the plasma treater 10 was retained in all other respects. As shown by the examples reported below, this wire-cloth embodiment provided noticeable improvements over the prior art but, inasmuch as it still produced some streamers, it did not yield a steady glow discharge at atmospheric pressure. Earlier work with the same very fine metal cloth (up to 600 mesh was tried) wrapped over a conventional electrode also produced an acceptable glow discharge with some streamers, but better results were obtained by passing the gas through the wire mesh. All embodiments of the invention are illustrated schematically in FIGS. 5, 6 and 7 for a perfused porous-metal strip 34, a perfused wire-cloth strip 54, and a wrapped wire-cloth strip 56, respectively. The actual plasma treater 10 is shown placed on a web roller 12 in the overview of FIG. 8.

The plasma treater of the invention was used for etching polymeric substrates and for treating biologically contaminated materials. Using different porous metals and wire cloths, the openings in the electrode were varied from about 0.1 microns to about 50 microns in effective diameter. We confirmed the hypothesis that having pores of appropriate size is the key to sustaining a uniform and steady plasma at atmospheric conditions. Based on our experiments, the optimal pore size appears to be in the range between the mean free path of the plasma and 10 to 20 times that size, best results being produced up to about 10 times the mean fee path. Such porous material of the electrode allows extremely uniform gas flow distribution along the whole area of the electrode and provides numerous extremely small cavities that are believed to also act as hollow cathodes, thereby enhancing plasma intensity.

Organic films such as polypropylene, polyethylene, and polyethylene teraphthalate substrates, commonly used in the food-packaging industry, were treated in the plasma treater of the invention at atmospheric conditions. Various AC-voltage frequencies were used in the 60 Hz to 20 kHz range without noticeable difference in the results. Surface energies of these films were substantially enhanced by the plasma treatment. Table 1 reports the processing conditions and the range of plasma compositions for some of the tests conducted with the atmospheric plasma treater of the invention to obtain a steady and uniform plasma. The remarks adjacent to the data exemplify the results.

TABLE 1

| Power Input, W | Metal | Pore size, μ | Gas, % | | | | | | | | | Remarks |
|---|---|---|---|---|---|---|---|---|---|---|---|---|
| | | | He | Ar | O₂ | CO₂ | N₂ | Air | H₂ | CH₄ | NH₃ | |
| 200 | SS316 | 0.2 | 100 | 0 | 0 | 0 | 0 | 0 | 0 | 0 | 0 | uniform plasma |
| | | | 0–45 | 0–55 | 0 | 0 | 0 | 0 | 0 | 0 | 0 | |
| | | | 0–70 | 0 | 0–30 | 0 | 0 | 0 | 0 | 0 | 0 0 | |
| | | | 0–50 | 0 | 0 | 0–50 | 0 | 0 | 0 | 0 | 0 | |
| | | | 0–80 | 0 | 0 | 0 | 0–20 | 0 | 0 | 0 | 0 | |
| | | | 0–75 | 0 | 0 | 0 | 0 | 0–25 | 0 | 0 | 0 | |
| | | | 0–90 | 0 | 0 | 0 | 0 | 0 | 0–10 | 0 | 0 | |
| | | | 0–95 | 0 | 0 | 0 | 0 | 0 | 0 | 0–5 | 0–5 | |
| | | | 0–95 | 0 | 0 | 0 | 0 | 0 | 0 | 0 | | |
| 200 | SS316 | 0.5 | 100 | 0 | 0 | 0 | 0 | 0 | 0 | 0 | 0 | uniform plasma |
| | | | 0–70 | 0 | 0–30 | 0 | 0 | 0 | 0 | 0 | 0 | |
| 200 | SS316 | 2.0 | 100 | 0 | 0 | 0 | 0 | 0 | 0 | 0 | 0 | uniform plasma |
| | | | 0–50 | 0 | 0–50 | 0 | 0 | 0 | 0 | 0 | 0 | |
| | | | 0–50 | 0 | 0 | 0–50 | 0 | 0 | 0 | 0 | 0 | |
| | | | 0–80 | 0 | 0 | 0 | 0–20 | 0 | 0 | 0 | 0 | |
| | | | 0–75 | 0 | 0 | 0 | 0 | 0–25 | 0 | 0 | 0 | |
| 200 | SS316 | 5.0 | 100 | 0 | 0 | 0 | 0 | 0 | 0 | 0 | 0 | uniform plasma |
| 200 | SS316 | 10.0 | 100 | 0 | 0 | 0 | 0 | 0 | 0 | 0 | 0 | uniform plasma |
| | | | 0–75 | 0 | 0 | 0–25 | 0 | 0 | 0 | 0 | 0 | |
| 200 | SS316 | 20.0 | 100 | 0 | 0 | 0 | 0 | 0 | 0 | 0 | 0 | plasma and some streamers |
| | | | 0–75 | 0 | 0–25 | 0 | 0 | 0 | 0 | 0 | 0 | |
| 200 | Bronze | 5.0 | 100 | 0 | 0 | 0 | 0 | 0 | 0 | 0 | 0 | uniform plasma |
| 200 | Bronze | 10.0 | 100 | 0 | 0 | 0 | 0 | 0 | 0 | 0 | 0 | uniform plasma |
| 200 | Bronze | 20.0 | 100 | 0 | 0 | 0 | 0 | 0 | 0 | 0 | 0 | plasma and some streamers |
| 200 | SS316 | 37* | 100 | 0 | 0 | 0 | 0 | 0 | 0 | 0 | 0 | plasma and some streamers |
| 200 | SS316 | 44* | 100 | 0 | 0 | 0 | 0 | 0 | 0 | 0 | 0 | plasma and some streamers |
| 200 | SS316 | 22* | 100 | 0 | 0 | 0 | 0 | 0 | 0 | 0 | 0 | uniform plasma |

*mesh size, tests with screen

It is clear from these data that the use of a porous electrode constructed at least in part with a porous metal produces a uniform plasma at atmospheric conditions for pore sizes up to about 20 microns. Larger sizes (22, 37 and 44 microns, obtained with wire cloth) produced a plasma with some streamers. The porous metal electrode also produced a uniform plasma with a variety of gas mixtures containing as low as 45 percent helium. As the data below indicate, surface energies of the treated films were substantially enhanced after the plasma treatment.

EXAMPLE 1

Film treated: Polypropylene (PP) film
Base surface energy: 30 dynes/cm
Web speed: 18 ft/min
Drum dielectric film: PET; Four inch plasma treater
Tables 2, 3 and 4 below show the results of plasma treatment of polypropylene film using helium and mixtures of helium and carbon dioxide, helium and oxygen, and helium and nitrogen in the amounts reported.

TABLE 2

| | Gases | | Power | Surface Energy, dynes/cm | | | |
|---|---|---|---|---|---|---|---|
| Sample | He cc/min | CO₂ cc/min | Input, W | 0 | 20 hrs | 96 hrs | 168 hrs |
| 1 | 300 | 0 | 200 | 46 | 44 | 44 | 42 |
| 2 | 300 | 15 | 200 | 58 | 54 | 46 | 46 |
| 3 | 300 | 30 | 200 | 58 | 52 | 44 | 42 |
| 4 | 300 | 60 | 200 | 58 | 52 | 48 | 46 |
| 5 | 300 | 75 | 200 | 58 | 52 | 46 | 46 |

TABLE 3

| | Gases | | Power | Surface Energy, dynes/cm | | | |
|---|---|---|---|---|---|---|---|
| Sample | He cc/min | O₂ cc/min | Input, W | 0 | 20 hrs | 75 hrs | 168 hrs |
| 1 | 300 | 7.5 | 200 | 54 | 52 | 50 | 48 |
| 2 | 300 | 15 | 200 | 54 | 50 | 50 | 48 |
| 3 | 300 | 30 | 200 | 56 | 52 | 46 | 44 |
| 4 | 300 | 60 | 200 | 54 | 52 | 48 | 42 |
| 5 | 300 | 90 | 200 | 56 | 52 | 48 | 46 |

TABLE 4

| | Gases | | Power | Surface Energy, dynes/cm | | | |
|---|---|---|---|---|---|---|---|
| Sample | He cc/min | N₂ cc/min | Input, W | 0 | 20 hrs | 75 hrs | 168 hrs |
| 1 | 300 | 15 | 200 | 54 | 52 | 52 | 48 |
| 2 | 300 | 30 | 200 | 54 | 50 | 48 | 42 |
| 3 | 300 | 60 | 200 | 56 | 50 | 50 | 44 |

EXAMPLE 2

Film treated: Polyethylene teraphthalate (PET) film
Base surface energy: 40 dynes/cm
Drum Speed: 18 ft/min
Drum dielectric film: PET; Four inch plasma treater
Tables 5, 6 and 7 below show the results of plasma treatment of polyethylene teraphthalate film using helium and mixtures of helium and carbon dioxide, helium and oxygen, and helium and nitrogen in the reported amounts.

TABLE 5

| Sample | Gases He cc/min | Gases $CO_2$ cc/min | Power Input W | Surface Energy, dynes/cm 0 | Surface Energy, dynes/cm 20 hrs | Surface Energy, dynes/cm 75 hrs | Surface Energy, dynes/cm 168 hrs |
|---|---|---|---|---|---|---|---|
| 1 | 300 | 0 | 200 | 56 | n/a | 52 | 52 |
| 2 | 300 | 15 | 200 | 54 | 54 | 50 | 50 |
| 3 | 300 | 30 | 200 | 58 | 54 | 50 | 50 |
| 4 | 300 | 60 | 200 | 56 | 54 | 54 | 54 |
| 5 | 300 | 75 | 200 | 56 | 54 | 52 | 48 |

TABLE 6

| Sample | Gases He cc/min | Gases $O_2$ cc/min | Power Input, W | Surface Energy, dynes/cm 0 | Surface Energy, dynes/cm 20 hrs | Surface Energy, dynes/cm 75 hrs | Surface Energy, dynes/cm 168 hrs |
|---|---|---|---|---|---|---|---|
| 1 | 300 | 15 | 200 | 52 | 50 | 50 | 48 |
| 2 | 300 | 30 | 200 | 52 | 50 | 48 | 46 |
| 3 | 300 | 60 | 200 | 52 | 50 | 50 | 50 |
| 4 | 300 | 90 | 200 | 54 | 54 | 52 | 48 |

TABLE 7

| Sample | Gases He cc/min | Gases $N_2$ cc/min | Power Input, W | Surface Energy, dynes/cm 0 | Surface Energy, dynes/cm 48 hrs | Surface Energy, dynes/cm 168 hrs |
|---|---|---|---|---|---|---|
| 1 | 300 | 15 | 200 | 56 | 56 | 52 |
| 2 | 300 | 30 | 200 | 56 | 56 | 52 |
| 3 | 300 | 60 | 200 | 58 | 56 | 52 |
| 4 | 300 | 90 | 200 | 58 | 52 | 52 |

EXAMPLE 3

Film Treated: Polyethylene (PE) film
Base surface energy: 30 dynes/cm
Drum Speed: 18 ft/min
Drum dielectric film: PET; Four inch plasma treater
Tables 8, 9 and 10 show the results of plasma treatment of polyethylene film using helium and mixtures of helium and carbon dioxide, helium and oxygen, and helium and nitrogen in the reported amounts.

TABLE 8

| Sample | Gases He cc/min | Gases $CO_2$ cc/min | Power Input W | Surface Energy, dynes/cm 0 | Surface Energy, dynes/cm 20 hrs | Surface Energy, dynes/cm 168 hrs |
|---|---|---|---|---|---|---|
| 1 | 300 | 0 | 200 | 54 | 48 | 46 |
| 2 | 300 | 15 | 200 | 50 | 50 | 44 |
| 3 | 300 | 30 | 200 | 50 | 46 | 40 |
| 4 | 300 | 60 | 200 | 50 | 46 | 44 |

TABLE 9

| Sample | Gases He cc/min | Gases $O_2$ cc/min | Power Input W | Surface Energy, dynes/cm 0 | Surface Energy, dynes/cm 20 hrs | Surface Energy, dynes/cm 168 hrs |
|---|---|---|---|---|---|---|
| 1 | 300 | 15 | 200 | 56 | 48 | 46 |
| 2 | 300 | 30 | 200 | 54 | 46 | 44 |
| 3 | 300 | 60 | 200 | 54 | 44 | 40 |
| 4 | 300 | 90% | 200 | 52 | 40 | 40 |

TABLE 10

| Sample | Gases He cc/min | Gases $N_2$ cc/min | Power Input W | Surface Energy, dynes/cm 0 | Surface Energy, dynes/cm 20 hrs | Surface Energy, dynes/cm 168 hrs |
|---|---|---|---|---|---|---|
| 1 | 300 | 15 | 200 | 52 | 46 | 40 |
| 2 | 300 | 30 | 200 | 52 | 42 | 38 |
| 3 | 300 | 60 | 200 | 52 | 40 | 38 |

These results show that the apparatus of the invention can be used for treating and modifying the surface properties of organic and inorganic materials. This plasma-treatment system does not require any vacuum equipment, it produces high density plasma, and the treatment of various surfaces can be performed at low temperatures and at atmospheric pressure. In addition, we found that a steady glow discharge can be produced at substantially lower frequencies than previously possible. Many tests were run routinely with success at 1 kHz, and good glow discharge was produced at frequencies as low as 60 Hz. In addition, the porous electrode of the invention made it possible to obtain steady atmospheric glow discharge with gas mixtures containing as little as 45 percent helium, which is not possible with any prior-art device.

Thus, those skilled in the art will readily appreciate the wide range of potential applications for this invention in areas such as surface treatment/functionalization of polymer films for the food-packaging industry; plasma-enhanced chemical vapor deposition for barrier films in the packaging industry; plasma etching for the microelectronics industry; plasma grafting and plasma polymerization; the treatment of fabrics, wool, metal and paper; and the sterilization of biologically contaminated materials. In particular, surface functionalization of polymer films by plasma is the most effective way for a uniform and controlled treatment. Using this invention, the surface energy of the films can be controlled by plasma treatment to enhance the wettability, printability and adhesion of coatings.

Various changes in the details, steps and components that have been described may be made by those skilled in the art within the principles and scope of the invention herein illustrated and defined in the appended claims. Therefore, while the present invention has been shown and described herein in what is believed to be the most practical and preferred embodiments, it is recognized that departures can be made therefrom within the scope of the invention, which is not to be limited to the details disclosed herein but is to be accorded the full scope of the claims so as to embrace any and all equivalent processes and products.

What is claimed is:

1. Apparatus for producing a glow-discharge plasma at substantially atmospheric pressure, comprising the following combination of components:
   a pair of opposing electrodes operating at substantially atmospheric pressure, at least one of the electrodes comprising a metallic porous layer;

means for applying a voltage across the electrodes; and means for diffusing a plasma gas through said metallic porous layer.

2. The apparatus of claim 1, further comprising a dielectric layer placed between said opposing electrodes.

3. The apparatus of claim 2, wherein said electrode comprising a metallic porous layer includes an enclosed tubular structure containing a metallic porous portion, and said means for diffusing a plasma gas through the metallic porous layer includes a conduit into the enclosed tubular structure.

4. The apparatus of claim 3, further comprising a baffle within said enclosed tubular structure, said baffle containing a plurality of perforations adapted to produce a substantially uniform flow of the plasma gas to the metallic porous portion.

5. The apparatus of claim 4, wherein said plasma gas has a mean free path at atmospheric pressure and the metallic porous portion has pores with an effective diameter substantially within one order of magnitude greater than said mean free path.

6. The apparatus of claim 1, further comprising means for passing a web through said glow-discharge plasma in order to enhance a surface characteristic of the web.

7. The apparatus of claim 1, wherein said plasma gas has a mean free path at atmospheric pressure and the metallic porous layer has pores with an effective diameter substantially within one order of magnitude greater than said mean free path.

8. The apparatus of claim 7, wherein said plasma gas comprises helium and said pores have an effective diameter smaller than 20 microns.

9. The apparatus of claim 1, wherein said electrode comprising a metallic porous layer includes an enclosed tubular structure containing a metallic porous portion, and said means for diffusing a plasma gas through the metallic porous layer includes a conduit into the enclosed tubular structure.

10. The apparatus of claim 9, further comprising a baffle within said enclosed tubular structure, said baffle containing a plurality of perforations adapted to produce a substantially uniform flow of the plasma gas to the metallic porous portion.

11. The apparatus of claim 10, wherein said plasma gas has a mean free path at atmospheric pressure and the metallic porous portion has pores with an effective diameter substantially within one order of magnitude greater than said mean free path.

12. Apparatus for producing a glow-discharge plasma at substantially atmospheric pressure, comprising the following combination of components:

a pair of opposing electrodes;

a metallic wire-cloth layer attached to at least one of the electrodes;

means for applying a voltage across the electrodes; and means for diffusing a plasma gas through said electrode wherein said metallic wire-cloth layer is at least as fine as 200 mesh.

13. The apparatus of claim 12, wherein said metallic wire-cloth layer is wrapped over said at least one of the electrodes.

14. The apparatus of claim 12, further comprising means for diffusing the plasma gas through said metallic wire-cloth layer.

15. The apparatus of claim 14, further comprising means for passing a web through said glow-discharge plasma in order to enhance a surface characteristic of the web.

16. A method for producing a glow-discharge plasma at substantially atmospheric pressure, comprising the following steps:

providing a pair of opposing electrodes operating at substantially atmospheric pressure, at least one of the electrodes comprising a metallic porous layer;

applying a voltage across the electrodes; and diffusing a plasma gas through said metallic porous layer.

17. The method of claim 16, further comprising the step of placing a dielectric layer between said opposing electrodes.

18. The method of claim 16, wherein said electrode comprising a metallic porous layer includes an enclosed tubular structure containing a metallic porous portion, and said step of diffusing a plasma gas through the metallic porous layer is carried out through a conduit feeding the enclosed tubular structure.

19. The method of claim 18, further comprising a baffle within said enclosed tubular structure, said baffle containing a plurality of perforations adapted to produce a substantially uniform flow of the plasma gas to the metallic porous portion.

20. The method of claim 16, wherein said plasma gas has a mean free path at atmospheric pressure and the metallic porous layer has pores with an effective diameter substantially within one order of magnitude greater than said mean free path.

21. The method of claim 16, wherein said plasma gas comprises helium and said pores have an effective diameter smaller than 20 microns.

22. The method of claim 16, further comprising the step of passing a web through said glow-discharge plasma in order to enhance a surface characteristic of the web.

* * * * *